(12) United States Patent
O'Keeffe et al.

(10) Patent No.: US 8,094,755 B2
(45) Date of Patent: Jan. 10, 2012

(54) RAMPING IN MULTIMODE TRANSMITTERS USING PRIMED FILTERS

(75) Inventors: Conor O'Keeffe, Douglas (IE); Robert O'Sullivan, Carrigaline (IE); Patrick Pratt, Gort na Greige (IE)

(73) Assignee: Freescale Semiconductor, Inc., Austin, TX (US)

( * ) Notice: Subject to any disclaimer, the term of this patent is extended or adjusted under 35 U.S.C. 154(b) by 973 days.

(21) Appl. No.: 11/994,766

(22) PCT Filed: Jul. 4, 2005

(86) PCT No.: PCT/EP2005/053175
§ 371 (c)(1),
(2), (4) Date: Jan. 4, 2008

(87) PCT Pub. No.: WO2007/003233
PCT Pub. Date: Jan. 11, 2007

(65) Prior Publication Data
US 2008/0310552 A1 Dec. 18, 2008

(51) Int. Cl.
*H04L 27/22* (2006.01)

(52) U.S. Cl. ........ 375/329; 375/295; 375/298; 375/302; 375/308; 370/345; 370/336; 370/337; 370/347; 332/151

(58) Field of Classification Search .................. 375/329, 375/295, 298, 302, 308; 332/151; 370/345, 370/336, 337, 347

See application file for complete search history.

(56) References Cited

U.S. PATENT DOCUMENTS

| 4,621,173 | A | * | 11/1986 | Guidoux | 370/291 |
|---|---|---|---|---|---|
| 5,745,527 | A | | 4/1998 | Kelton et al. | |
| 6,834,084 | B2 | | 12/2004 | Hietala | |
| 7,027,498 | B2 | * | 4/2006 | McCarty, Jr. | 375/232 |
| 7,099,907 | B1 | * | 8/2006 | Nakayama | 708/300 |
| 7,719,376 | B2 | * | 5/2010 | Lampe et al. | 332/108 |
| 2002/0168026 | A1 | * | 11/2002 | Khoini-Poorfard | 375/303 |
| 2002/0176514 | A1 | * | 11/2002 | Schell | 375/298 |
| 2004/0208157 | A1 | * | 10/2004 | Sander et al. | 370/345 |
| 2005/0220219 | A1 | * | 10/2005 | Jensen | 375/302 |
| 2005/0286653 | A1 | * | 12/2005 | Lai et al. | 375/308 |

FOREIGN PATENT DOCUMENTS

| JP | 10198913 A | 7/1998 |
|---|---|---|
| WO | 03034676 A2 | 4/2003 |
| WO | 03036896 A2 | 5/2003 |
| WO | 2005055541 A1 | 6/2005 |

OTHER PUBLICATIONS

3GPP Standards GSM 05.02 version 8.2.1.
3GPP Standards GSM 05.04 version 8.1.2.

* cited by examiner

*Primary Examiner* — Siu Lee

(57) ABSTRACT

A modulation system can switch between two modulation modes. In order to comply with limits on peak power in spectral bands outside the RF operating one the transmitter is required to ramp down to a condition of minimal power. To avoid fixed ramping and trailing bits, the transmitting signal is subjected to FIR filtering. The two FIR filters are primed with a sequence using a parallel input mode before serially entering the information data.

21 Claims, 5 Drawing Sheets

RAMPING IN MULTIMODE TRANSMITTERS USING PRIMED FILTERS

FIELD OF THE INVENTION

This invention relates to a modulator apparatus of the type, for example, comprising a digital filter. This invention also relates to a modulation system of the type, for example, comprising a modulator apparatus coupled to a controller. This invention further relates to a method of controlling an output of a modulator apparatus.

BACKGROUND OF THE INVENTION

In the field of wireless communications, in particular cellular communications, existing cellular telecommunications systems now support so-called 2.5G and 3G features. In this respect, support is now available for high-speed data communications in Global System for Mobile communications (GSM) networks, known as Enhanced Data rates for GSM Evolution (EDGE) or an Enhanced General Packet Radio Service (EGPRS).

To support EGPRS, wireless communications handsets, referred to as Mobile Stations (MSs) in some telecommunications standards, are typically equipped with a number of transmit modulator functions, typically two digital modulators. Consequently, it is known for a first modulator to support a Gaussian Minimum-Shift Keying (GMSK) modulation scheme and a second modulator to support an $3\pi/8$ rotated 8 Phase Shift Keying (PSK) modulation scheme.

In order to support transmission of different types of information requiring use of different modulation schemes, for example data or logical channel signalling information, the wireless handset is capable of switching between the first and second modulators, for example on an adjacent slot of a multi-slot transmission. Such so-called multi-mode capability is known, for example from U.S. Pat. No. 6,834,084 and US patent publication no. 2002/0176514 A1.

U.S. Pat. No. 6,834,084 discloses a modulator capable of overcoming problems associated with use of linear power amplifiers, current demands of quadrature modulators and incompatibilities of transmit paths with certain existing standardised transmit methodologies. To this end, a polar modulator is disclosed comprising a polar converter, a digital pre-distortion filter and a phase locked loop. The polar modulator as described in U.S. Pat. No. 6,834,084 does not suffer from the previously known problem of non-contemporaneous arrival of phase and amplitude signals at the power amplifier.

In relation to the need to switch between modulators, the Third Generation Partnership Project (3GPP) Standard GSM 05.02 version 8.5.1 (ETSI EN 300 902 V8.5.1) provides for a guard band period, a period between information transmission bursts, to provide a time alignment margin for a base station receiver. During such guard band periods, 3GPP Standard GSM 05.05 version 8.5.1 (ETSI EN 300 910 V8.5.1) specifies that the response of a given transmitter adhering to the guard band must not contravene specified limits on peak power in spectral bands outside the RF band in which the given transmitter is operating. To achieve such attenuation of transmissions or when switching a modulator on or off, it can be necessary to cause the response of the given transmitter to ramp down to a condition of minimal power output from a condition of information-bearing modulation and then ramp back up to the condition of information-bearing modulation.

US patent publication no. 2002/0176514 A1 discloses a technique to control response of respective modulators used to provide EDGE, D-AMPS and GMSK modulation so as to control ramping up and down of the respective modulators. However, the profile of modulator response during ramping periods cannot be controlled easily, beyond the fixed ramping profile used.

Such inflexibility is disadvantageous, because the guard band period can, in some circumstances (such as an Access Burst followed by a Normal Burst having up to a 63 symbol timing advance in a multi-slot transmission), vary leading to shortened guard band periods during which the response of the modulator has to ramp up or down at a fixed rate, resulting in contention for processing time. Additionally, some power amplifier circuits used to amplify modulated signals do not ramp up and "settle" or ramp down and settle symmetrically in time.

In order to achieve the ramp profiles described in US patent publication no. 2002/0176514 A1, additional information, which is appended and pre-pended to information symbols, which include trailing bits, to achieve the desired ramping profile, needs to be transferred from the baseband processor to the modulator, resulting in a software burden on the baseband processor.

Furthermore, a number of known transmitters are not capable of strict compliance with a standardised slot size of 156.25 symbols/slot due to an inability of some modulators to re-start in sufficient time in the guard band period at a quarter symbol boundary of a given slot. Consequently, a symbol is inserted into a frame of slots every fourth slot, thereby maintaining a frame length as defined in the 3GPP Standard GSM 05.02 mentioned above. The need to insert an additional symbol every fourth slot creates a processing burden on the baseband processor to maintain the non-uniform slot lengths over a number of slots transmitted. Consequently, some guard bands are longer than others and there is a need to use a so-called "Layer 1 timer" in the baseband processor to monitor the guard band that is, effectively, extended in order to track a so-called power vs. time mask of the transmitter that has been adjusted as a result of the need to insert the additional symbol. However, when a need arises to switch between modulators, for example between a GMSK modulator and an 8 PSK modulator, the above-described solution, albeit problematic, is inapplicable, since a phase and amplitude discontinuities would occur between an undefined end point of phase and amplitude associated with the GMSK modulator and a starting phase and amplitude associated with the 8 PSK modulator.

STATEMENT OF INVENTION

According to the present invention, there is provided a modulator apparatus, a modulation system and a method of controlling an output of a modulator apparatus as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
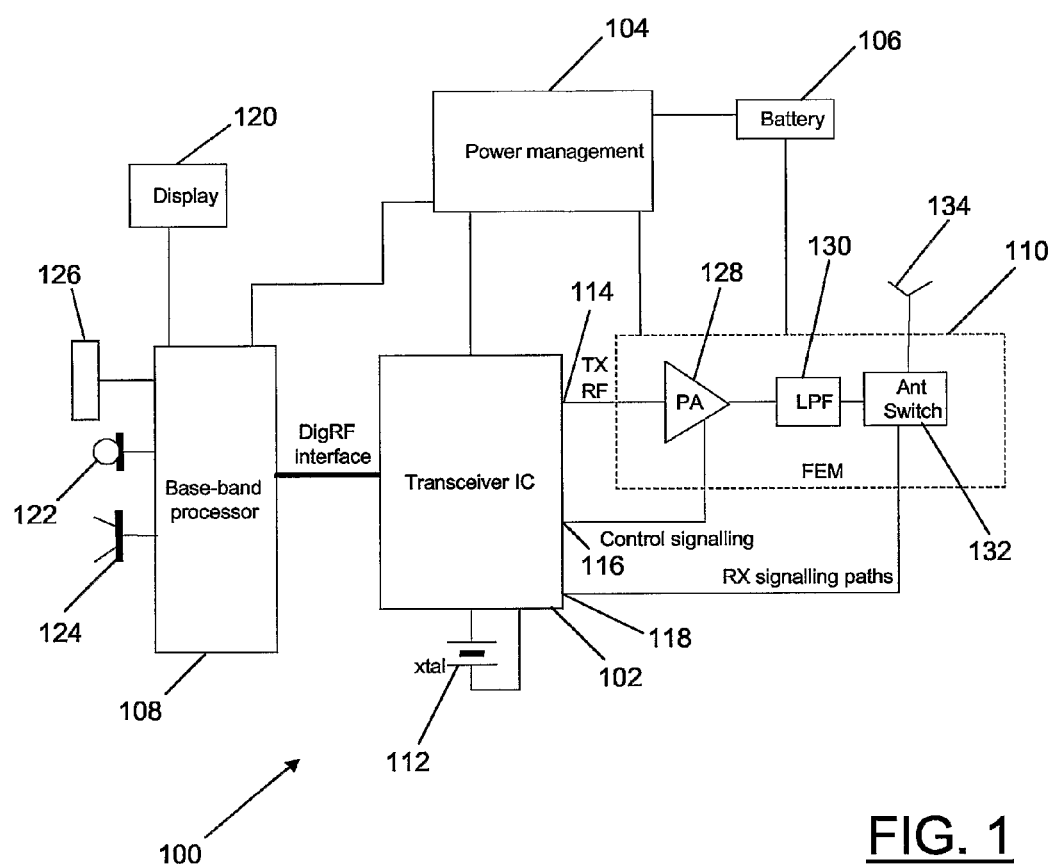
FIG. 1 is a schematic diagram of a communications apparatus comprising a transceiver integrated circuit.

Throughout the following description identical reference numerals will be used to identify like parts.

Referring to FIG. 1, a communications apparatus 100, for example a wireless communications device, such as a cellular telephone handset, comprises a transceiver Integrated Circuit (IC) 102, the transceiver IC 102 coupled to a power management unit 104. The power management unit 104 is coupled to a power source, for example a battery 106, and a baseband processor unit 108. The power management unit 104 and the battery 106 are also coupled to a front-end module 110.

As well as being coupled to the baseband processor unit 108 and the front-end module 110, the transceiver IC 102 is also coupled to a crystal 112 that serves as a source of a reference clock signal. Additionally, the transceiver IC 102 is coupled to the front-end module 110 via a transmission Radio Frequency (RF) output 114, a control signalling output 116 and a receiver signalling input 118.

For the sake of completeness, the baseband processor unit 108 is coupled to a number of input/output devices, for example a display 120, a microphone 122, a loadspeaker 124 and a keypad 126.

The front-end module 110 comprises a power amplifier circuit 128, an input of which is coupled to the transmission RF output 114 and an output of which is coupled to a low-pass filter 130, the low-pass filter 130 being coupled to an antenna switch 132. The antenna switch 132 is coupled to an antenna 134 and the receiver signalling unit 118.

Figure 2:
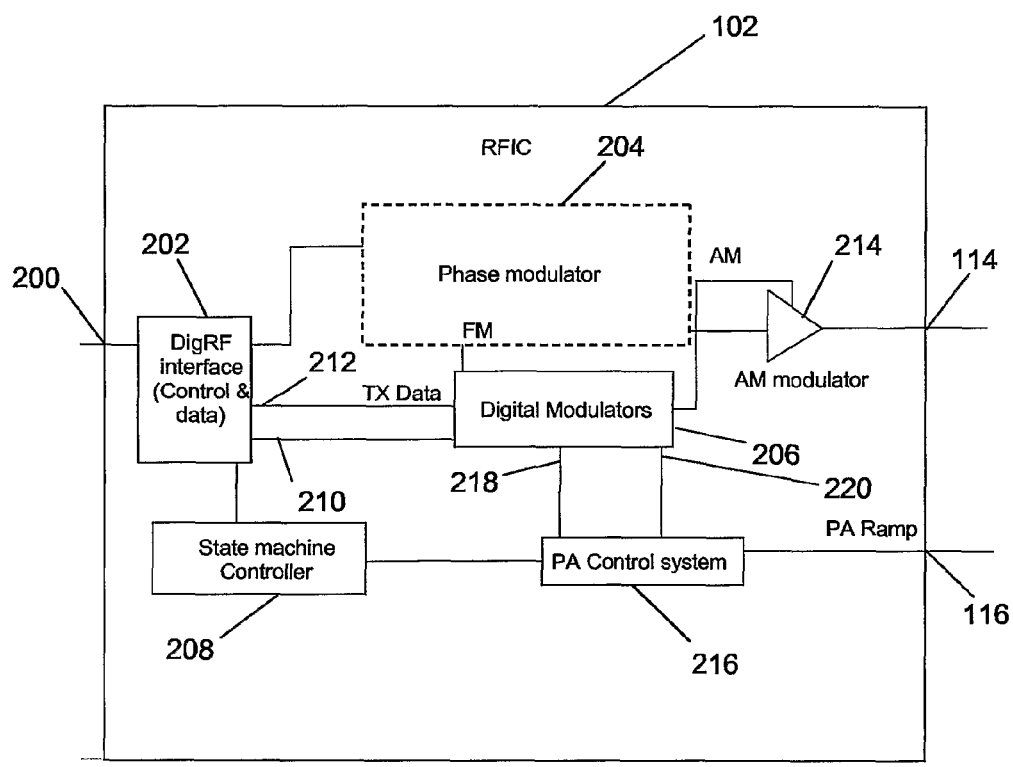
FIG. 2 is a schematic diagram of a transmitter portion of the transceiver integrated circuit of FIG. 1.

Turning to FIG. 2, the transceiver IC 102 comprises an input 200 coupled to the baseband processor unit 108. The input 200 is also coupled to a digital RF interface unit 202, the digital RF interface unit 202 being coupled to a phase modulator unit 204, a digital modulator 206, and a controller 208 implementing a state machine. The controller 208 is, in this example, coupled to the digital modulator 206 via a plurality of control lines 210 between the digital RF interface unit 202 and the digital modulator 206, the digital RF interface unit 202 also being coupled to the digital modulator 206 via a transmission data link 212. Although the controller 208 is described herein as coupled to the digital modulator 206 via the digital RF interface unit 202, the skilled person will appreciate that a direct connection can be employed.

The digital modulator 206 is also coupled to the phase modulator unit 204, a control input of an amplitude modulator 214, and a power amplifier control unit 216, the digital modulator 206 being coupled to the power amplifier control unit 216 via a first control link 218 and a second control link 220. The phase modulator unit 204 is also coupled to an input of the amplitude modulation amplifier 214, and the power amplifier control unit 216 is also coupled to the controller 208.

An output of amplitude modulator 214 is coupled to the transmission RF output 114 and an output of the power amplifier control unit 216 is coupled to the control signalling output 116 via an anti-aliasing filter (not shown).

Figure 3:
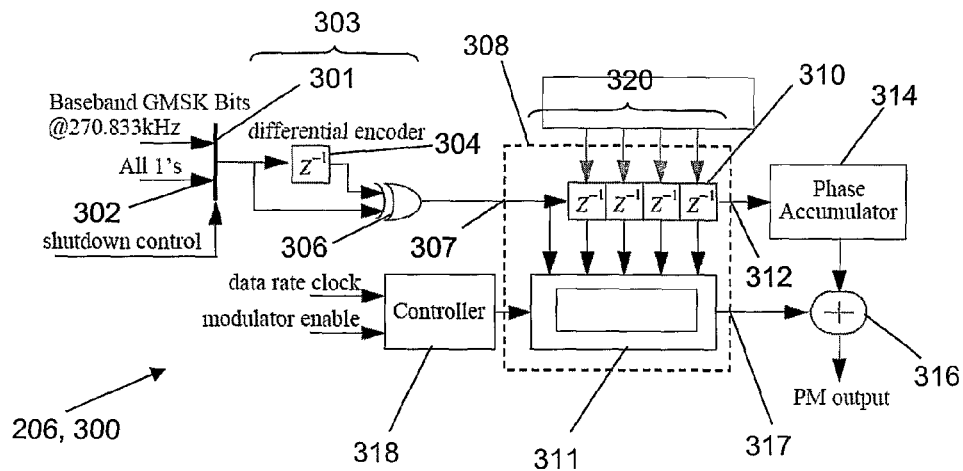
FIG. 3 is a schematic diagram of a first modulator apparatus constituting an embodiment of the invention.

In a first embodiment (FIG. 3), the modulator 206 is a GMSK modulator 300 comprising a switching device (not shown), a first input of which is coupled to a modulator input 301 and a second input of which is coupled to a source of logic 1's 302 internal to the modulator 300. An output of the switching device is coupled to a differential encoder unit 303 that serves to condition data in a signal path originating from the modulator input 301 or the source of logic 1's 302 as described in the 3GPP Standard GSM 05.04.

The differential encoder unit 303 comprises a first delay element 304 coupled to a first input of an Exclusive OR (XOR) gate 306, a second input of the XOR gate 306 being coupled to an input of the first delay element 304. An output of the XOR gate 306 is coupled to a serial input 307 of a first finite impulse response filter 308, the filter 308 having a plurality of taps 310. The plurality of taps 310 being coupled in parallel to a first tap coefficient scaler and summation unit 311. In this example, the first filter 308 is a GMSK filter, the structure of which is known from as described in the 3GPP Standard GSM 05.04 and so for the sake of conciseness and clarity of description, the structure of the first filter 308 will not be described further herein. However, it should be pointed out that the first filter 308 requires a 5 symbol history to define a predeterministic stimulus response.

A first output 312 of the first filter 308 is coupled to the plurality of taps 310 and a phase accumulator 314, the phase accumulator 314 being coupled to a first summation unit 316, a second output 317 of the first filter 308 also being coupled to the first tap coefficient scaler and summation unit 311 and the first summation unit 316. An output of the first summation unit 316 is coupled to an input of the phase modulator unit 204. A first local controller 318 is also coupled to the first filter 308 for controlling activity of the first filter 308.

In addition to the serial input 308 of the first filter 308, the first filter 308 also comprises a first plurality of inputs 320 arranged in parallel. The first plurality of inputs 320 are respectively coupled to the plurality of taps 310.

Figure 4:
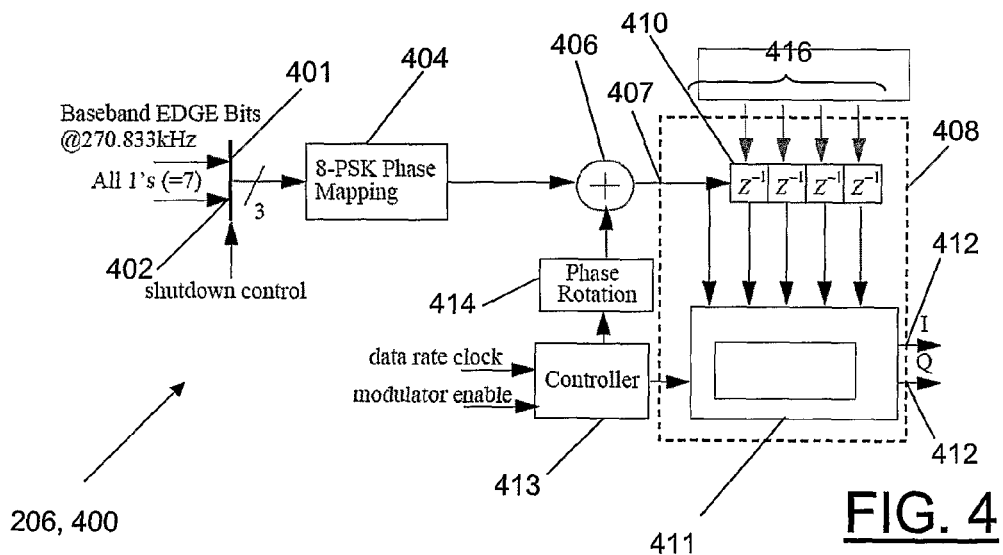
FIG. 4 is a schematic diagram of a second modulator apparatus constituting a second embodiment of the invention.

In a second embodiment (FIG. 4), the modulator 206 is an EDGE modulator 400 comprising another switching device (not shown), a first input of which is coupled to a modulator input 401 and a second input of which is coupled to a source of symbols 402 equating to the number "7". An output of the switching device is coupled to an 8PSK phase mapping unit 404 that serves to condition data flowing along a data path originating from the modulator input 401 or the source of symbols.

An output of the phase mapping unit 404 is coupled to a first input of a second summation unit 406, an output of the second summation unit 406 being coupled to a serial input 407 of a second finite impulse response filter 408, the second filter 408 having a second plurality of taps 410. The second plurality of taps 410 is coupled in parallel to a second tap coefficient scaler and summation unit 411. In this example, the second filter 408 is an 8PSK EDGE filter, the structure of which is known from the 3GPP Standard GSM 05.04 and so for the sake of conciseness and clarity of description, the structure of the second filter 408 will not be described further herein. However, again, it should be pointed out that the second filter 408 uses a 5 symbol history to define a predeterministic stimulus response.

The second filter 408 has I and Q outputs 412. Although not shown in this example, the I and Q outputs 412 are coupled to a CoORinate DIgital Computer (CORDIC) to convert Cartesian vectors (I and Q) to polar vectors.

A first output of a second local controller 413 is also coupled to the second filter 408 for controlling activity of the second filter 408. A second output of the second local controller 413 is coupled to a second input of the second summation unit 406 via a $3\pi/8$ phase rotation unit 414.

In addition to the serial input 407 of second filter 408, the second filter 408 also comprises a second plurality of inputs 416 arranged in parallel. The second plurality of inputs 416 are respectively coupled to the second plurality of taps 410.

In the above examples, the GMSK modulator 300 and the EDGE modulator 400 are described in the context of being sole modulators in different communications apparatus 100. However, in a third embodiment, where multi-mode functionality is required of the communications apparatus 100, the modulator 206 comprises, for example, both the GMSK and EDGE modulators 300, 400, each of the GMSK and EDGE modulators 300, 400 being capable of being switchably coupled to the power amplifier 128 via a modulator input/output switching device for coupling the digital RF interface unit 202 and the control input of the amplitude modulation amplifier 214 between the GMSK modulator 300 and the EDGE modulator 400. However, the skilled person will appreciate that the combination of the GMSK and EDGE modulators 300, 400 can be a single re-configurable modulator. Consequently, the communications apparatus 100 can be capable of both GMSK and EDGE modulation.

In order to convey to the skilled person all of the advantageous features of each of the above two modulators, the operation of the above two modulators will now be described in the context of the above-mentioned third embodiment comprising a combination of the GMSK modulator 300 and the EDGE modulator 400. In this respect, for some applications, it is desirable to stop a modulator at one side of a boundary of a ¼ of a symbol and then re-start the modulator, or another modulator at or shortly after another side of the boundary of the ¼ of the symbol. In the exemplary operation to be described hereafter, the GMSK modulator 300 is initially active, providing GSMK modulation. At the boundary of the ¼ of the symbol, in a guard band between time slots, the GMSK modulator 300 is made inactive and the EDGE modulator 400 is activated.

Figure 5:
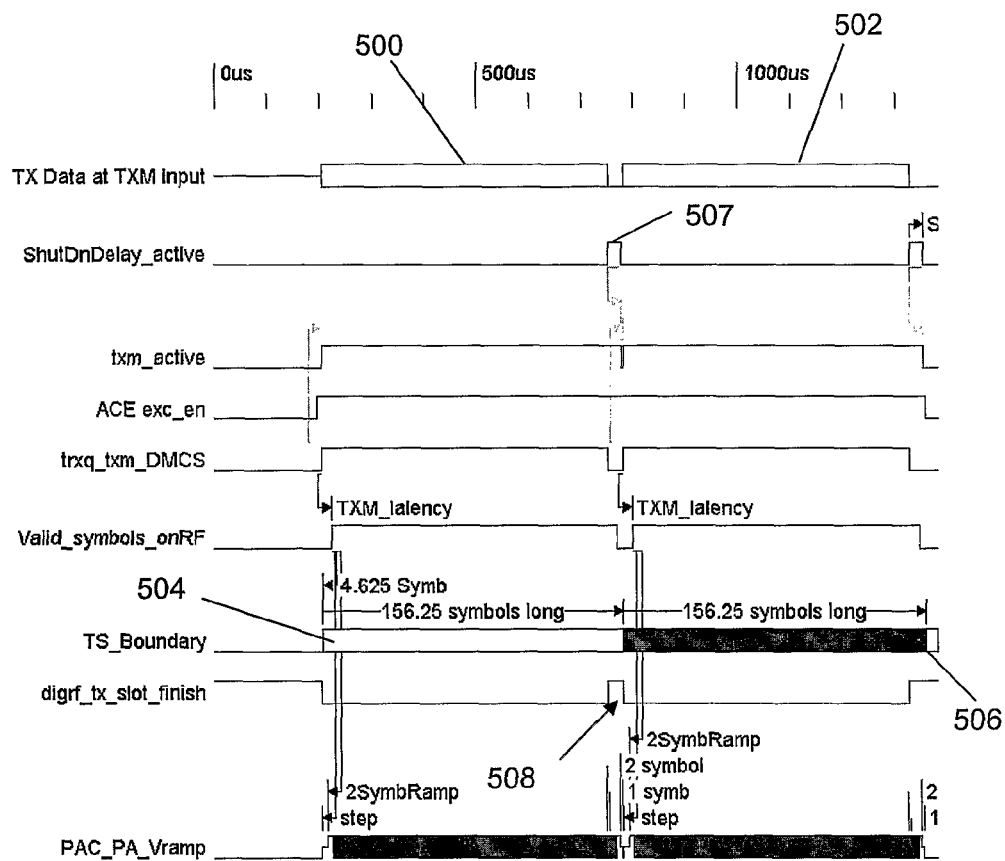
FIG. 5 is a timing diagram of operation of the first or second embodiments of FIG. 3 or 4.
Figure 6:
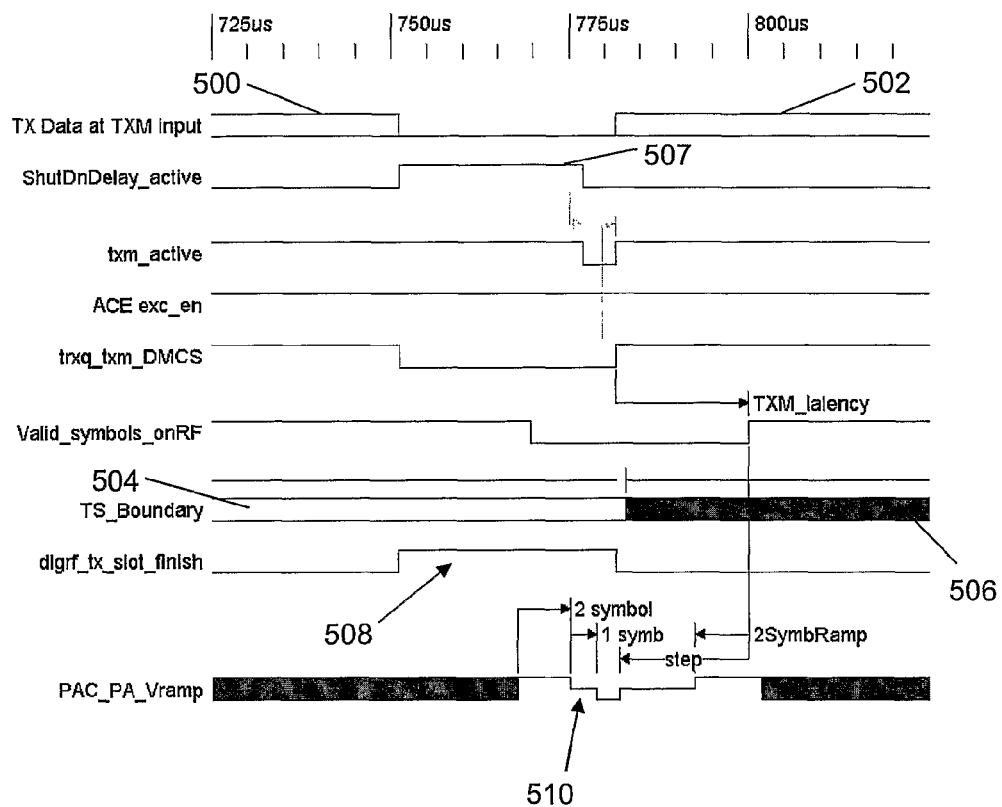
FIG. 6 is a timing diagram showing a part of the timing diagram of FIG. 5 in greater detail.

Consequently, in operation (FIGS. 5 and 6), the baseband processor 108 arranges data to be transmitted into time slots of a frame and initiates transmission of a first stream of baseband data 500 corresponding to a first time slot 504, of 156.25 symbols, of the frame. The first stream of baseband data 500 will be followed by a second stream of baseband data 502 corresponding to a second, and subsequent, time slot 506 of the frame. Subsequently, the controller 208 detects transmission of the first stream of baseband data 500 through a first control signal received from the digital RF interface 202. The controller 208 identifies a type of modulation to be employed, for example GMSK or EDGE modulation, from a configuration signal received from the digital RF interface 02 or through analysis of the type of data in the first stream of baseband data, for example groups of 4 bits having a first bit indicating a modulation scheme to be employed.

In this example, the modulation scheme identified by the controller 208 is GMSK modulation. Consequently, the controller 208 generates a second control signal to the GMSK modulator 300 instructing the GMSK modulator 300 to power-up and begin clocking-in data from the modulator input 301. A third and subsequent control signal is then sent by the controller 208 to the GMSK modulator 300 instructing the GMSK modulator 300 to apply a first plurality of priming bits to the first plurality of taps 310 via the first plurality of parallel inputs 320. In addition, the first delay element 304, constituting a filter tap for the purpose of priming the first filter 308, is also primed with a logic value. In this example, the first plurality of priming bits is a series of logic 1's to be applied in parallel to all but a first of the first plurality of taps 310, a first bit of the first stream of baseband data, after conditioning by the differential encoder unit 303, being applied to the first tap of the first plurality of taps 310.

As a result of application of this initial stimulus, the first filter 308 generates a first instantaneous impulse response. Thereafter, the remaining bits of the first stream of baseband data 500 (in a like manner to the first bit of the first plurality of baseband data) received from the baseband processor 108 is then conditioned by the differential encoder unit 303, resulting in an encoded output signal that is in a format compatible with the first filter 308; the encoded output signal then reaches the first filter 308, resulting in the first filter 308 continuing the impulse response with a data burst portion that is continuous with the first instantaneous impulse response.

Although not previously mentioned, the GMSK modulator 300 comprises a first counter (not shown) that counts the number of bits received by the GSMK modulator 300. The contents of the first counter are communicated by the GMSK modulator 300 to the controller 208, the controller 208 comparing the number of bits received by the GMSK modulator 300 from the baseband processor 108 with a predetermined number of bits, for example 148 bits. The predetermined number of bits is associated with a size of a time slot, an end of an active part of the time slot being deemed reached by the controller once the GMSK modulator 300 has received the predetermined number of bits.

Thereafter, in response to the predetermined number of bits being reached, the controller 208 generates a third control signal 508 that is communicated to the GMSK modulator 300, instructing the GMSK modulator 300 to actuate the first switching device so as to couple the source of logic 1's to the differential encoder 303. The logic 1's are thus appended to the end of the first stream of baseband data 500 received by the GMSK modulator 300 from the baseband processor 108. Consequently, the logic 1's appended to the end of the first stream of baseband data are clocked into the first filter 308 after the stream of data, resulting in the impulse response of the first filter 308 changing back to a desired output impulse response.

At this point, depending upon an application to which a subsequent time slot relates, the GMSK modulator 300 can be used to modulate the second stream of baseband data 502 in the second time slot 506 or, as in this example, another modulator, such as the EDGE modulator 400 can be employed to modulate the second stream of baseband data 502.

In this respect, the controller 208 detects transmission of the second stream of baseband data 502 through the first control signal received from the digital RF interface 202, but in respect of the second stream of baseband data 502. The controller then identifies a type of modulation to be employed for the second stream of baseband data 502 in a like manner to that already described above in relation to the GMSK modulator 300. Since EDGE modulation is to be employed in respect of the second stream of baseband data 502, the controller 208 also instructs 507 the GMSK modulator 300 to become inactive within the guard band period, which occurs whilst information bearing modulation is being transmitted. The controller 208 then issues a fourth control signal to the EDGE modulator 400 instructing the EDGE modulator 400 to power-up and begin clocking-in data via the modulator input 401. Thereafter, a fifth and subsequent control signal is sent by the controller 208 to the EDGE modulator 400, instructing the EDGE modulator 400 to apply a second plurality of priming bits to the second plurality of taps 410 via the second plurality of parallel inputs 416. In this example, the second plurality of priming bits is a series of n-bit data units to be applied in parallel to all but a first of the second plurality of taps 410, a first symbol of the second stream of baseband data 502, after conditioning by the phase mapping unit 404, the second summation unit 406 and the phase rotation unit 414, being applied to the first tap of the second plurality of taps 410. As a result of application of this initial stimulus, the second filter 408 generates a third instantaneous impulse response. The third instantaneous impulse response of the second filter 408 is maximally flat Amplitude Modulation (AM) output and dependent upon the second plurality of priming bits. Thereafter, the remaining bits of the second stream of baseband data 502 (in a like manner to the first bit of the second plurality of baseband data 502) received from the baseband processor 108 are by the received by the GMSK modulator 300 and then subsequently conditioned by the 8PSK phase mapping unit 404 in combination with the second summation unit 406 and the phase rotation unit 414 to yield an 8 PSK output signal; the 8 PSK output signal then reaches the second filter 408, resulting in the second filter 408 continuing the third impulse response with a subsequent data burst portion continuous with the third instantaneous impulse response.

Although not previously mentioned, the EDGE modulator 400 also comprises a second counter (not shown) that counts the number of symbols received by the EDGE modulator 400. The contents of the second counter are communicated by the EDGE modulator 400 to the controller 208, the controller 208 comparing the number of symbols received by the EDGE modulator 400 from the baseband processor 108 with a predetermined number of symbols, for example 148 symbols. The predetermined number of symbols is associated with a size of the subsequent time slot, an end of an active part of the subsequent time slot being deemed reached by the controller 208 once the EDGE modulator 400 has received the predetermined number of symbols.

Thereafter, in response to the predetermined number of symbols being reached, the controller 208 generates a fifth control signal that is communicated to the EDGE modulator 400, instructing the EDGE modulator 400 to actuate the first switching device so as to couple the source of "7" symbols to the phase mapping unit 404. The "7" symbols are thus appended to the end of the second stream of baseband data 502 received by the EDGE modulator 400 from the baseband processor 108. Consequently, the "7" symbols appended to the end of the second stream of baseband data 502 are, after processing by the phase mapping unit 404 and added with a phase rotated output of the second filter 408, clocked into the second filter 408 after the translated second stream of baseband data 502, resulting in the impulse response of the second filter 408 changing back to a maximally flat AM impulse response. It should be appreciated that the maximally flat AM impulse responses can be scaled if desired by the power amplifier control system 216.

In the above examples, 5 symbols are used to prime the GMSK and EDGE filters 308, 408 in order to obtain a substantially flat impulse response. However, the skilled person will appreciate that a sufficient number of logic 1's or other data can be employed in order to permit the power amplifier 128 to ramp down.

Whilst in the above examples, finite impulse response filters are employed, the skilled person will appreciate that other filter structures can be employed in conjunction with the above described technique dependent upon application of the modulator 206.

Although the above examples have been described in the context of using a source of logic 1's and a source of n-bit data units (or other data) to prime the first and second plurality of taps 310, 410, respectively, the skilled person will appreciate that other mechanisms exist for ensuring that the first and second plurality of taps 310, 410 are activated in a desired initial state. For example, the first and second plurality of taps 310, 410 can be respective pluralities of flip-flops, it being possible to configure the flip-flops to commence operation in an initial state, the initial state being equivalent to providing the plurality of logic 1's (or other data) via the first and second pluralities of inputs 320, 416.

It should be appreciated that the above examples substitute a number of the trailing symbols usually used to surround the active part of a time slot with one or more priming bit patterns.

It is thus possible to provide a modulator apparatus, a modulator system and a method of controlling an output of a modulator that enables switching on and off, or switching between modulators at a boundary of a ¼ of a symbol between time slots, whilst providing a means to cope with phase discontinuities between an end of a first output of a power amplifier in respect of a first time slot and a second output of the power amplifier in respect of a second time slot. By being able to switch off and on a given modulator or switch between modulators at the boundary of the ¼ of the symbol, baseband software overhead can be reduced. Further, the act of switching off and on a modulator or switching between modulators does not contravene RF switching frequency requirements of some communications standards or time power vs. time mask requirement of some communications standards.

The invention claimed is:

1. A modulator apparatus comprising:
   a first digital filter associated with a predetermined modulation scheme, the first filter having a first shift register including a first plurality of taps and arranged to generate, when in use, a first impulse response in response to a first input stimulus; and
   the first plurality of taps being capable of being substantially simultaneously initialized by an initialization-reset feature of the first shift register, when in use, to a first priming bit pattern prior to receipt of a stream of serial input data, the initialization of the first plurality of taps being in response to a first control signal;
   the first priming bit pattern corresponding to a predetermined profile of a part of the first impulse response.

2. The modulator apparatus as claimed in claim 1, wherein the first filter comprises a first input for serial receipt of a stream of data.

3. The modulator apparatus as claimed in claim 1, wherein the first priming bit pattern corresponds to a substantially flat amplitude modulation impulse response.

4. The modulator apparatus as claimed in claim 1, wherein the first impulse response comprises at least one of a first primed portion and a second primed portion separated from the first primed portion by an information burst portion.

5. An The modulator apparatus as claimed in claim 1, further comprising:
   a local controller coupled to the first filter.

6. An The modulator apparatus as claimed in claim 1, further comprising:
   a data path conditioner arranged to translate, when in use, a stream of baseband data into the serial stream of input data having a format compatible with the first filter.

7. The modulator apparatus as claimed in claim 6, wherein the data path conditioner is arranged to differentially encode the stream of baseband data.

8. The modulator apparatus as claimed in claim 6, wherein the data path conditioner is arranged to perform a phase map and phase rotation operations in relation to the stream of baseband data.

9. The modulator apparatus as claimed in claim 8, wherein the data path conditioner is arranged to 8PSK phase map the stream of baseband data.

10. The modulator apparatus as claimed in claim 1, further comprising:
a source of a second priming bit pattern.

11. The modulator apparatus as claimed in claim 10, wherein the source of the second priming bit pattern is arranged to append, when in use, the second priming bit pattern to a plurality of baseband information bits in response to a second control signal.

12. The modulator apparatus as claimed in claim 1, further comprising:
a second digital filter associated with a second predetermined modulation scheme, the second filter having a second plurality of taps and arranged to generate, when in use, a second impulse response in response to a second input stimulus; wherein
the second plurality of taps is capable of being substantially simultaneously initialized, when in use, to a second priming bit pattern prior to receipt of another stream of serial input data, the initialization of the second plurality of taps being in response to a third control signal.

13. The modulator apparatus as claimed in claim 12, wherein the second digital filter is a second finite impulse response filter.

14. The modulator apparatus as claimed in claim 12, wherein the second plurality of taps is a second shift register, the second plurality of taps being initialized by using an initialization-reset feature of the second shift register.

15. The modulator apparatus as claimed in claim 1, wherein the first filter is a first finite impulse response filter.

16. A modulation system comprising the modulator apparatus as claimed in claim 1, the system further comprising:
a controller coupled to the modulator apparatus for controlling application of the first and/or second priming bit patterns to the first filter.

17. A GMSK or EDGE modulator comprising the modulator apparatus as claimed in claim 1.

18. A wireless communications apparatus comprising the modulator apparatus as claimed in claim 1.

19. A method of controlling an output of a modulator having a finite impulse response (FIR) filter, the method comprising:
receiving at the modulator a stream of baseband information corresponding to a slot of data; and
coupling in response to a first control signal the stream of baseband information to a first tap of a plurality of taps of the FIR filter, and applying a first priming bit pattern substantially simultaneously to the remaining taps of the plurality of taps of the FIR filter,
the first priming bit pattern corresponding to a predetermined profile of a part of a first impulse response.

20. The method of claim 19 further comprising:
determining an end of an active portion of the stream of baseband information; and
coupling, in response to the determining, a stream of priming bits to the first tap in place of a plurality of trailing bits included within the stream of baseband information.

21. A method comprising:
receiving at a modulator a stream of baseband information including a plurality of frames, each frame of the plurality of frames including a plurality of trailing bits; and
providing a first impulse response at a digital filter based on the stream of baseband information and based on a set of priming bits, wherein a portion of the plurality of trailing bits is substituted with the set of priming bits, and wherein the set of priming bits is applied substantially simultaneously to a plurality of taps of a shift register included at the digital filter.

* * * * *